US009443938B2

United States Patent
Mishra et al.

(10) Patent No.: US 9,443,938 B2
(45) Date of Patent: Sep. 13, 2016

(54) III-NITRIDE TRANSISTOR INCLUDING A P-TYPE DEPLETING LAYER

(71) Applicant: Transphorm Inc., Goleta, CA (US)

(72) Inventors: Umesh Mishra, Montecito, CA (US);
Rakesh K. Lal, Isla Vista, CA (US);
Stacia Keller, Santa Barbara, CA (US);
Srabanti Chowdhury, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 2 days.

(21) Appl. No.: 14/327,371

(22) Filed: Jul. 9, 2014

(65) Prior Publication Data

US 2015/0021552 A1    Jan. 22, 2015

Related U.S. Application Data

(60) Provisional application No. 61/856,573, filed on Jul. 19, 2013.

(51) Int. Cl.
| | |
|---|---|
| *H01L 29/06* | (2006.01) |
| *H01L 29/20* | (2006.01) |
| *H01L 29/66* | (2006.01) |
| *H01L 29/778* | (2006.01) |
| *H01L 29/04* | (2006.01) |
| *H01L 29/51* | (2006.01) |

(52) U.S. Cl.
CPC ......... *H01L 29/2003* (2013.01); *H01L 29/045* (2013.01); *H01L 29/66462* (2013.01); *H01L 29/7783* (2013.01); *H01L 29/51* (2013.01)

(58) Field of Classification Search
None
See application file for complete search history.

(56) References Cited

U.S. PATENT DOCUMENTS

| | | | |
|---|---|---|---|
| 4,300,091 | A | 11/1981 | Schade, Jr. |
| 4,532,439 | A | 7/1985 | Koike |
| 4,645,562 | A | 2/1987 | Liao et al. |
| 4,728,826 | A | 3/1988 | Einzinger et al. |
| 4,821,093 | A | 4/1989 | Iafrate et al. |
| 4,914,489 | A | 4/1990 | Awano |
| 5,051,618 | A | 9/1991 | Lou |
| 5,329,147 | A | 7/1994 | Vo et al. |
| 5,618,384 | A | 4/1997 | Chan et al. |

(Continued)

FOREIGN PATENT DOCUMENTS

| | | |
|---|---|---|
| CN | 1748320 | 3/2006 |
| CN | 101107713 | 1/2008 |
| CN | 101312207 | 11/2008 |
| CN | 101897029 | 11/2010 |

(Continued)

OTHER PUBLICATIONS

U.S. Appl. No. 11/856,695, filed Sep. 17, 2007, Gallium Nitride Diodes and Integrated Components.

(Continued)

*Primary Examiner* — David E Graybill
(74) *Attorney, Agent, or Firm* — Fish & Richardson P.C.

(57) ABSTRACT

A transistor includes a III-N layer structure comprising a III-N channel layer between a III-N barrier layer and a p-type III-N layer. The transistor further includes a source, a drain, and a gate between the source and the drain, the gate being over the III-N layer structure. The p-type III-N layer includes a first portion that is at least partially in a device access region between the gate and the drain, and the first portion of the p-type III-N layer is electrically connected to the source and electrically isolated from the drain. When the transistor is biased in the off state, the p-type layer can cause channel charge in the device access region to deplete as the drain voltage increases, thereby leading to higher breakdown voltages.

10 Claims, 5 Drawing Sheets

(56) References Cited

U.S. PATENT DOCUMENTS

| | | |
|---|---|---|
| 5,646,069 A | 7/1997 | Jelloian et al. |
| 5,663,091 A | 9/1997 | Yen et al. |
| 5,705,847 A | 1/1998 | Kashiwa et al. |
| 5,714,393 A | 2/1998 | Wild et al. |
| 5,909,103 A | 6/1999 | Williams |
| 5,998,810 A | 12/1999 | Hatano et al. |
| 6,008,684 A | 12/1999 | Ker et al. |
| 6,097,046 A | 8/2000 | Plumton |
| 6,100,571 A | 8/2000 | Mizuta et al. |
| 6,292,500 B1 | 9/2001 | Kouchi et al. |
| 6,307,220 B1 | 10/2001 | Yamazaki |
| 6,316,793 B1 | 11/2001 | Sheppard et al. |
| 6,373,082 B1 | 4/2002 | Ohno et al. |
| 6,429,468 B1 | 8/2002 | Hsu et al. |
| 6,475,889 B1 | 11/2002 | Ring |
| 6,486,502 B1 | 11/2002 | Sheppard et al. |
| 6,504,235 B2 | 1/2003 | Schmitz et al. |
| 6,515,303 B2 | 2/2003 | Ring |
| 6,548,333 B2 | 4/2003 | Smith |
| 6,552,373 B2 | 4/2003 | Ando et al. |
| 6,580,101 B2 | 6/2003 | Yoshida |
| 6,583,454 B2 | 6/2003 | Sheppard et al. |
| 6,586,781 B2 | 7/2003 | Wu et al. |
| 6,624,452 B2 | 9/2003 | Yu et al. |
| 6,649,497 B2 | 11/2003 | Ring |
| 6,727,531 B1 | 4/2004 | Redwing et al. |
| 6,746,938 B2 | 6/2004 | Uchiyama et al. |
| 6,777,278 B2 | 8/2004 | Smith |
| 6,849,882 B2 | 2/2005 | Chavarkar et al. |
| 6,867,078 B1 | 3/2005 | Green et al. |
| 6,914,273 B2 | 7/2005 | Ren et al. |
| 6,946,739 B2 | 9/2005 | Ring |
| 6,979,863 B2 | 12/2005 | Ryu |
| 6,982,204 B2 | 1/2006 | Saxler et al. |
| 7,030,428 B2 | 4/2006 | Saxler |
| 7,045,404 B2 | 5/2006 | Sheppard et al. |
| 7,053,413 B2 | 5/2006 | D'Evelyn et al. |
| 7,071,498 B2 | 7/2006 | Johnson et al. |
| 7,078,743 B2 | 7/2006 | Murata et al. |
| 7,084,475 B2 | 8/2006 | Shelton et al. |
| 7,109,552 B2 | 9/2006 | Wu |
| 7,125,786 B2 | 10/2006 | Ring et al. |
| 7,126,212 B2 | 10/2006 | Enquist et al. |
| 7,161,194 B2 | 1/2007 | Parikh et al. |
| 7,169,634 B2 | 1/2007 | Zhao et al. |
| 7,170,111 B2 | 1/2007 | Saxler |
| 7,199,640 B2 | 4/2007 | De Cremoux et al. |
| 7,217,960 B2 | 5/2007 | Ueno et al. |
| 7,227,198 B2 | 6/2007 | Pavier et al. |
| 7,238,560 B2 | 7/2007 | Sheppard et al. |
| 7,250,641 B2 | 7/2007 | Saito et al. |
| 7,253,454 B2 | 8/2007 | Saxler |
| 7,265,399 B2 | 9/2007 | Sriram et al. |
| 7,268,375 B2 | 9/2007 | Shur et al. |
| 7,304,331 B2 | 12/2007 | Saito et al. |
| 7,321,132 B2 | 1/2008 | Robinson et al. |
| 7,326,971 B2 | 2/2008 | Harris et al. |
| 7,332,795 B2 | 2/2008 | Smith et al. |
| 7,364,988 B2 | 4/2008 | Harris et al. |
| 7,375,407 B2 | 5/2008 | Yanagihara et al. |
| 7,382,001 B2 | 6/2008 | Beach |
| 7,388,236 B2 | 6/2008 | Wu et al. |
| 7,419,892 B2 | 9/2008 | Sheppard et al. |
| 7,429,534 B2 | 9/2008 | Gaska et al. |
| 7,432,142 B2 | 10/2008 | Saxler et al. |
| 7,436,001 B2 | 10/2008 | Lee et al. |
| 7,449,730 B2 | 11/2008 | Kuraguchi |
| 7,456,443 B2 | 11/2008 | Saxler et al. |
| 7,465,967 B2 | 12/2008 | Smith et al. |
| 7,465,997 B2 | 12/2008 | Kinzer et al. |
| 7,482,788 B2 | 1/2009 | Yang |
| 7,488,992 B2 | 2/2009 | Robinson |
| 7,501,669 B2 | 3/2009 | Parikh et al. |
| 7,501,670 B2 | 3/2009 | Murphy |
| 7,508,014 B2 | 3/2009 | Tanimoto |
| 7,544,963 B2 | 6/2009 | Saxler |
| 7,547,925 B2 | 6/2009 | Wong et al. |
| 7,548,112 B2 | 6/2009 | Sheppard |
| 7,550,781 B2 | 6/2009 | Kinzer et al. |
| 7,550,783 B2 | 6/2009 | Wu et al. |
| 7,550,784 B2 | 6/2009 | Saxler et al. |
| 7,566,580 B2 | 7/2009 | Keller et al. |
| 7,566,918 B2 | 7/2009 | Wu et al. |
| 7,573,078 B2 | 8/2009 | Wu et al. |
| 7,592,211 B2 | 9/2009 | Sheppard et al. |
| 7,598,108 B2 | 10/2009 | Li et al. |
| 7,601,993 B2 | 10/2009 | Hoshi et al. |
| 7,605,017 B2 | 10/2009 | Hayashi et al. |
| 7,612,363 B2 | 11/2009 | Takeda et al. |
| 7,612,390 B2 | 11/2009 | Saxler et al. |
| 7,615,774 B2 | 11/2009 | Saxler |
| 7,629,627 B2 | 12/2009 | Mil'shtein et al. |
| 7,638,818 B2 | 12/2009 | Wu et al. |
| 7,655,962 B2 | 2/2010 | Simin et al. |
| 7,678,628 B2 | 3/2010 | Sheppard et al. |
| 7,692,263 B2 | 4/2010 | Wu et al. |
| 7,700,973 B2 | 4/2010 | Shen et al. |
| 7,709,269 B2 | 5/2010 | Smith et al. |
| 7,709,859 B2 | 5/2010 | Smith et al. |
| 7,714,360 B2 | 5/2010 | Otsuka et al. |
| 7,723,739 B2 | 5/2010 | Takano et al. |
| 7,728,356 B2 | 6/2010 | Suh et al. |
| 7,745,851 B2 | 6/2010 | Harris |
| 7,755,108 B2 | 7/2010 | Kuraguchi |
| 7,759,699 B2 | 7/2010 | Beach |
| 7,759,700 B2 | 7/2010 | Ueno et al. |
| 7,777,252 B2 | 8/2010 | Sugimoto et al. |
| 7,777,254 B2 | 8/2010 | Sato |
| 7,795,622 B2 | 9/2010 | Kikkawa et al. |
| 7,795,642 B2 | 9/2010 | Suh et al. |
| 7,811,872 B2 | 10/2010 | Hoshi et al. |
| 7,812,369 B2 | 10/2010 | Chini et al. |
| 7,834,380 B2 | 11/2010 | Ueda et al. |
| 7,851,825 B2 | 12/2010 | Suh et al. |
| 7,855,401 B2 | 12/2010 | Sheppard et al. |
| 7,859,014 B2 | 12/2010 | Nakayama et al. |
| 7,859,020 B2 | 12/2010 | Kikkawa et al. |
| 7,859,021 B2 | 12/2010 | Kaneko |
| 7,875,537 B2 | 1/2011 | Suvorov et al. |
| 7,875,907 B2 | 1/2011 | Honea et al. |
| 7,875,910 B2 | 1/2011 | Sheppard et al. |
| 7,875,914 B2 | 1/2011 | Sheppard |
| 7,884,394 B2 | 2/2011 | Wu et al. |
| 7,884,395 B2 | 2/2011 | Saito |
| 7,892,974 B2 | 2/2011 | Ring et al. |
| 7,893,424 B2 | 2/2011 | Eichler et al. |
| 7,893,500 B2 | 2/2011 | Wu et al. |
| 7,898,004 B2 | 3/2011 | Wu et al. |
| 7,901,994 B2 | 3/2011 | Saxler et al. |
| 7,906,799 B2 | 3/2011 | Sheppard et al. |
| 7,915,643 B2 | 3/2011 | Suh et al. |
| 7,915,644 B2 | 3/2011 | Wu et al. |
| 7,919,791 B2 | 4/2011 | Flynn et al. |
| 7,928,475 B2 | 4/2011 | Parikh et al. |
| 7,932,539 B2 | 4/2011 | Chen et al. |
| 7,935,985 B2 | 5/2011 | Mishra et al. |
| 7,939,391 B2 | 5/2011 | Suh et al. |
| 7,948,011 B2 | 5/2011 | Rajan et al. |
| 7,955,918 B2 | 6/2011 | Wu et al. |
| 7,955,984 B2 | 6/2011 | Ohki |
| 7,960,756 B2 | 6/2011 | Sheppard et al. |
| 7,965,126 B2 | 6/2011 | Honea et al. |
| 7,973,335 B2 | 7/2011 | Okamoto et al. |
| 7,982,242 B2 | 7/2011 | Goto |
| 7,985,986 B2 | 7/2011 | Heikman et al. |
| 7,985,987 B2 | 7/2011 | Kaneko |
| 8,039,352 B2 | 10/2011 | Mishra et al. |
| 8,049,252 B2 | 11/2011 | Smith et al. |
| 8,076,698 B2 | 12/2011 | Ueda et al. |
| 8,076,699 B2 | 12/2011 | Chen et al. |
| 8,093,606 B2 | 1/2012 | Sonobe et al. |
| 8,110,425 B2 | 2/2012 | Yun |
| 8,114,717 B2 | 2/2012 | Palacios et al. |
| 8,138,529 B2 | 3/2012 | Wu |

(56) References Cited

U.S. PATENT DOCUMENTS

| | | |
|---|---|---|
| 8,153,515 B2 | 4/2012 | Saxler |
| 8,174,048 B2 | 5/2012 | Beach |
| 8,178,900 B2 | 5/2012 | Kurachi et al. |
| 8,193,562 B2 | 6/2012 | Suh et al. |
| 8,223,458 B2 | 7/2012 | Mochizuki et al. |
| 8,237,196 B2 | 8/2012 | Saito |
| 8,237,198 B2 | 8/2012 | Wu et al. |
| 8,264,003 B2 | 9/2012 | Herman |
| 8,289,065 B2 | 10/2012 | Honea et al. |
| 8,344,424 B2 | 1/2013 | Suh et al. |
| 8,361,816 B2 | 1/2013 | Lee et al. |
| 8,363,437 B2 | 1/2013 | Wang et al. |
| 8,389,975 B2 | 3/2013 | Kikuchi et al. |
| 8,389,977 B2 | 3/2013 | Chu et al. |
| 8,390,000 B2 | 3/2013 | Chu et al. |
| 8,404,042 B2 | 3/2013 | Mizuhara et al. |
| 8,431,960 B2 | 4/2013 | Beach et al. |
| 8,455,885 B2 | 6/2013 | Keller et al. |
| 8,455,931 B2 | 6/2013 | Wu |
| 8,471,267 B2 | 6/2013 | Hayashi et al. |
| 8,476,125 B2 | 7/2013 | Khan et al. |
| 8,492,779 B2 | 7/2013 | Lee |
| 8,493,129 B2 | 7/2013 | Honea et al. |
| 8,502,323 B2 | 8/2013 | Chen |
| 8,508,281 B2 | 8/2013 | Honea et al. |
| 8,519,438 B2 | 8/2013 | Mishra et al. |
| 8,525,231 B2 | 9/2013 | Park et al. |
| 8,531,232 B2 | 9/2013 | Honea et al. |
| 8,541,818 B2 | 9/2013 | Wu et al. |
| 8,592,974 B2 | 11/2013 | Wu |
| 8,598,937 B2 | 12/2013 | Lal et al. |
| 8,603,880 B2 | 12/2013 | Yamada |
| 8,614,460 B2 | 12/2013 | Matsushita |
| 8,624,662 B2 | 1/2014 | Parikh et al. |
| 8,633,518 B2 | 1/2014 | Suh et al. |
| 8,643,062 B2 | 2/2014 | Parikh et al. |
| 8,648,643 B2 | 2/2014 | Wu |
| 8,652,948 B2 | 2/2014 | Horie et al. |
| 8,674,407 B2 | 3/2014 | Ando et al. |
| 8,692,294 B2 | 4/2014 | Chu et al. |
| 8,698,198 B2 | 4/2014 | Kuraguchi |
| 8,716,141 B2 | 5/2014 | Dora et al. |
| 8,742,459 B2 | 6/2014 | Mishra et al. |
| 8,742,460 B2 | 6/2014 | Mishra et al. |
| 8,772,832 B2 | 7/2014 | Boutros |
| 8,772,842 B2 | 7/2014 | Dora |
| 8,786,327 B2 | 7/2014 | Honea et al. |
| 8,803,246 B2 | 8/2014 | Wu et al. |
| 8,816,497 B2 | 8/2014 | Wu |
| 8,816,751 B2 | 8/2014 | Honea et al. |
| 8,841,702 B2 | 9/2014 | Mishra et al. |
| 8,860,495 B2 | 10/2014 | Lal et al. |
| 8,895,421 B2 | 11/2014 | Parikh et al. |
| 8,895,423 B2 | 11/2014 | Dora |
| 2003/0006437 A1 | 1/2003 | Mizuta et al. |
| 2004/0119067 A1 | 6/2004 | Weeks, Jr. et al. |
| 2005/0133816 A1 | 6/2005 | Fan et al. |
| 2006/0076677 A1 | 4/2006 | Daubenspeck et al. |
| 2006/0145189 A1 | 7/2006 | Beach |
| 2006/0189109 A1 | 8/2006 | Fitzgerald |
| 2006/0202272 A1 | 9/2006 | Wu et al. |
| 2006/0226442 A1 | 10/2006 | Zhang et al. |
| 2007/0018199 A1 | 1/2007 | Sheppard et al. |
| 2007/0045670 A1 | 3/2007 | Kuraguchi |
| 2007/0128743 A1 | 6/2007 | Huang et al. |
| 2007/0131968 A1 | 6/2007 | Morita et al. |
| 2007/0145417 A1 | 6/2007 | Brar et al. |
| 2007/0205433 A1 | 9/2007 | Parikh et al. |
| 2007/0210329 A1 | 9/2007 | Goto |
| 2007/0228477 A1 | 10/2007 | Suzuki et al. |
| 2007/0249119 A1 | 10/2007 | Saito |
| 2007/0295985 A1 | 12/2007 | Weeks, Jr. et al. |
| 2008/0073670 A1 | 3/2008 | Yang et al. |
| 2008/0272397 A1 | 11/2008 | Koudymov et al. |
| 2008/0308813 A1 | 12/2008 | Suh et al. |
| 2009/0045438 A1 | 2/2009 | Inoue et al. |
| 2009/0050936 A1 | 2/2009 | Oka |
| 2009/0072269 A1 | 3/2009 | Suh et al. |
| 2009/0075455 A1 | 3/2009 | Mishra |
| 2009/0085065 A1 | 4/2009 | Mishra et al. |
| 2009/0140262 A1 | 6/2009 | Ohki et al. |
| 2010/0065923 A1 | 3/2010 | Charles et al. |
| 2010/0133506 A1 | 6/2010 | Nakanishi et al. |
| 2010/0203234 A1 | 8/2010 | Anderson et al. |
| 2010/0219445 A1 | 9/2010 | Yokoyama et al. |
| 2010/0264461 A1 | 10/2010 | Rajan et al. |
| 2011/0012110 A1 | 1/2011 | Sazawa et al. |
| 2012/0112202 A1 | 5/2012 | Hwang et al. |
| 2012/0217512 A1 | 8/2012 | Renaud |
| 2012/0267636 A1 | 10/2012 | Zundel et al. |
| 2012/0267637 A1 | 10/2012 | Jeon et al. |
| 2013/0056744 A1 | 3/2013 | Mishra et al. |
| 2013/0099285 A1 | 4/2013 | Hwang et al. |
| 2013/0175580 A1 | 7/2013 | Suh et al. |
| 2013/0328061 A1 | 12/2013 | Chu et al. |
| 2014/0084346 A1 | 3/2014 | Tajiri |

FOREIGN PATENT DOCUMENTS

| | | |
|---|---|---|
| CN | 102017160 | 4/2011 |
| CN | 103477543 | 12/2013 |
| CN | 103493206 | 1/2014 |
| EP | 1 998 376 | 12/2008 |
| EP | 2 188 842 | 5/2010 |
| JP | 11-224950 | 8/1999 |
| JP | 2000-058871 | 2/2000 |
| JP | 2003-229566 | 8/2003 |
| JP | 2003-244943 | 8/2003 |
| JP | 2004-260114 | 9/2004 |
| JP | 2006-032749 | 2/2006 |
| JP | 2006-033723 | 2/2006 |
| JP | 2007-036218 | 2/2007 |
| JP | 2007-215331 | 8/2007 |
| JP | 2008-199771 | 8/2008 |
| JP | 2010-087076 | 4/2010 |
| JP | 2010-525023 | 7/2010 |
| JP | 2010-539712 | 12/2010 |
| KR | 2011-0033584 | 3/2011 |
| TW | 200924068 | 6/2009 |
| TW | 200924201 | 6/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| TW | 201322443 | 6/2013 |
| WO | WO 2004/070791 | 8/2004 |
| WO | WO 2004/098060 | 11/2004 |
| WO | WO 2005/036749 | 4/2005 |
| WO | WO 2005/070007 | 8/2005 |
| WO | WO 2005/070009 | 8/2005 |
| WO | WO 2006/114883 | 11/2006 |
| WO | WO 2007/077666 | 7/2007 |
| WO | WO 2007/108404 | 9/2007 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |
| WO | WO 2010/039463 | 4/2010 |
| WO | WO 2010/068554 | 6/2010 |
| WO | WO 2010/090885 | 8/2010 |
| WO | WO 2010/132587 | 11/2010 |
| WO | WO 2011/031431 | 3/2011 |
| WO | WO 2011/072027 | 6/2011 |
| WO | WO 2013/052833 | 4/2013 |

OTHER PUBLICATIONS

U.S. Appl. No. 14/108,642, filed Dec. 17, 2013, Gallium Nitride Power Devices.

(56) References Cited

OTHER PUBLICATIONS

U.S. Appl. No. 60/971,721, filed Sep. 12, 2007, III-Nitride Bilateral Switches.
U.S. Appl. No. 60/972,467, filed Sep. 14, 2007, Growing N-Polar III-Nitride Structures.
U.S. Appl. No. 12/209,504, filed Sep. 12, 2008, Growing N-Polar III-Nitride Structures.
U.S. Appl. No. 60/972,481, filed Sep. 14, 2007, III-Nitride Devices with Recessed Gates.
U.S. Appl. No. 61/012,755, filed Dec. 10, 2007, Insulated Gate E-Mode Transistors.
U.S. Appl. No. 61/028,133, filed Feb. 12, 2008, Bridge Circuits and their Components.
U.S. Appl. No. 13/887,204, filed May 3, 2013, Bridge Circuits and their Components.
U.S. Appl. No. 14/539,098, filed Nov. 12, 2014, Bridge Circuits and their Components.
U.S. Appl. No. 14/464,639, filed Aug. 20, 2014, Enhancement Mode III-N HEMTs.
U.S. Appl. No. 61/099,451, filed Sep. 23, 2008, Inductive Load Power Switching Circuits.
U.S. Appl. No. 14/332,967, filed Jul. 16, 2014, Inductive Load Power Switching Circuits.
U.S. Appl. No. 13/973,890, filed Aug. 22, 2013, Semiconductor Heterostructure Diodes.
U.S. Appl. No. 14/063,438, filed Oct. 25, 2013, Package Configurations for Low Emi Circuits.
U.S. Appl. No. 13/756,284, filed Jan. 31, 2013, Methods of Forming Reverse Side Engineered III-Nitride Devices.
U.S. Appl. No. 14/262,649, filed Apr. 25, 2014, High Voltage III-Nitride Semiconductor Devices.
U.S. Appl. No. 14/178,701, filed Feb. 12, 2014, Semiconductor Devices with Field Plates.
U.S. Appl. No. 14/336,287, filed Jul. 21, 2014, Electronic Devices and Components for High Efficiency Power Circuits.
U.S. Appl. No. 14/058,089, filed Oct. 18, 2013, Semiconductor Electronic Components and Circuits.
U.S. Appl. No. 14/260,808, filed Apr. 24, 2014, Transistors with Isolated Regions.
U.S. Appl. No. 12/953,769, filed Nov. 24, 2010, Layer Structures for Controlling Stress of Heteroepitaxially Grown III-Nitride Layers.
U.S. Appl. No. 13/226,380, filed Sep. 6, 2011, Semiconductor Devices with Guard Rings.
U.S. Appl. No. 14/530,204, filed Oct. 31, 2014, Semiconductor Devices with Guard Rings.
U.S. Appl. No. 14/522,154, filed Oct. 23, 2014, III-N Device Structures and Methods.
U.S. Appl. No. 14/524,299, filed Oct. 27, 2014, Semiconductor Diodes with Low Reverse Bias Currents.
U.S. Appl. No. 14/211,104, filed Mar. 14, 2014, Electrode Configurations for Semiconductor Devices.
U.S. Appl. No. 61/447,519, filed Feb. 28, 2011, Electronic Components with Reactive Filters.
U.S. Appl. No. 14/307,234, filed Jun. 17, 2014, Method of Forming Electronic Components with Reactive Filters.
U.S. Appl. No. 61/568,022, filed Dec. 7, 2011, Semiconductor Modules and Methods of Forming the Same.
U.S. Appl. No. 13/690,103, filed Nov. 30, 2012, Semiconductor Modules and Methods of Forming the Same.
U.S. Appl. No. 13/366,090, filed Feb. 3, 2012, Buffer Layer Structures Suited for III-Nitride Devices with Foreign Substrates.
U.S. Appl. No. 14/134,878, filed Dec. 19, 2013, Semiconductor Power Modules and Devices.
U.S. Appl. No. 61/621,956, filed Apr. 9, 2012, N-Polar III-Nitride Transistors.
U.S. Appl. No. 13/859,635, filed Apr. 9, 2013, N-Polar III-Nitride Transistors.
U.S. Appl. No. 61/765,635, filed Feb. 15, 2013, Electrodes for Semiconductor Devices and Methods of Forming the Same.
U.S. Appl. No. 14/179,788, filed Feb. 13, 2014, Electrodes for Semiconductor Devices and Methods of Forming the Same.
U.S. Appl. No. 61/791,395, filed Mar. 15, 2013, Carbon Doping Semiconductor Devices.
U.S. Appl. No. 14/208,304, filed Mar. 13, 2014, Carbon Doping Semiconductor Devices.
U.S. Appl. No. 13/799,989, filed Mar. 13, 2013, Enhancement-Mode III-Nitride Devices.
U.S. Appl. No. 61/807,258, filed Apr. 1, 2013, Gate Drivers for Circuits Based on Semiconductor Devices.
U.S. Appl. No. 14/222,992, filed Mar. 24, 2014, Gate Drivers for Circuits Based on Semiconductor Devices.
U.S. Appl. No. 61/844,260, filed Jul. 9, 2013, Multilevel Inverters and their Components.
U.S. Appl. No. 14/321,269, filed Jul. 1, 2014, Multilevel Inverters and their Components.
U.S. Appl. No. 61/856,573, filed Jul. 19, 2013, III-Nitride Transistor Including a P-Type Depleting Layer.
U.S. Appl. No. 14/208,482, filed Mar. 13, 2014, Carbon Doping Semiconductor Devices.
U.S. Appl. No. 13/231,308, filed Sep. 13, 2011, III-N Device Structures Having a Non-Insulating Substrate.
U.S. Appl. No. 14/478,504, filed Sep. 5, 2014, Method of Forming Electronic Components with Increased Reliability.
U.S. Appl. No. 13/535,094, filed Jun. 27, 2012, Semiconductor Devices with Integrated Hole Collectors.
U.S. Appl. No. 14/311,600, filed Jun. 23, 2014, Semiconductor Electronic Components with Integrated Current Limiters.
U.S. Appl. No. 13/551,094, filed Jul. 17, 2012, Contacts for Semiconductor Devices and Methods of Forming the Same.
U.S. Appl. No. 61/672,723, filed Jul. 17, 2012, Devices and Components for Power Conversion Circuits.
U.S. Appl. No. 13/803,912, filed Mar. 14, 2013, Devices and Components for Power Conversion Circuits.
U.S. Appl. No. 14/323,777, filed Jul. 3, 2014, Switching Circuits Having Ferrite Beads.
U.S. Appl. No. 62/027,126, filed Jul. 21, 2014, Forming Enhancement Mode III-Nitride Devices.
U.S. Appl. No. 14/542,937, filed Nov. 17, 2014, Forming Enhancement Mode III-Nitride Devices.
Authorized officer Jun. Young Son, International Search Report and Written Opinion in PCT/US2014/046030, mailed Oct. 21, 2014, 12 pages.
Authorized officer Chung Keun Lee, International Search Report and Written Opinion in PCT/US2008/076030, mailed Mar. 23, 2009, 10 pages.
Authorized officer Yolaine Cussac, International Preliminary Report on Patentability in PCT/US2008/076030, Mar. 25, 2010, 5 pages.
Authorized officer Chung Keun Lee, International Search Report and Written Opinion in PCT/US2008/076079, mailed Mar. 20, 2009, 11 pages.
Authorized officer Nora Lindner, International Preliminary Report on Patentability in PCT/US2008/076079, mailed Apr. 1, 2010, 6 pages.
Authorized officer Keon Hyeong Kim, International Search Report and Written Opinion in PCT/US2008/076160 mailed Mar. 18, 2009, 11 pages.
Authorized officer Simin Baharlou, International Preliminary Report on Patentability in PCT/US2008/076160, mailed Mar. 25 2010, 6 pages.
Authorized officer Chung Keun Lee, International Search Report and Written Opinion in PCT/US2008/076199, mailed Mar. 24, 2009, 11 pages.
Authorized officer Dorothée Mülhausen, International Preliminary Report on Patentability in PCT/US2008/076199, mailed Apr. 1, 2010, 6 pages.
Authorized officer Keon Hyeong Kim, International Search Report and Written Opinion in PCT/US2008/085031, mailed Jun. 24, 2009, 11 pages.
Authorized officer Yolaine Cussac, International Preliminary Report on Patentability in PCT/US2008/085031, mailed Jun. 24, 2010, 6 pages.

(56) References Cited

OTHER PUBLICATIONS

Authorized officer Tae Hoon Kim, International Search Report and Written Opinion in PCT/US2009/041304, mailed Dec. 18, 2009, 13 pages.
Authorized officer Dorothée Mülhausen, International Preliminary Report on Patentability, in PCT/US2009/041304, mailed Nov. 4, 2010, 8 pages.
Authorized officer Sung Hee Kim, International Search Report and the Written Opinion in PCT/US2009/057554, mailed May 10, 2010, 13 pages.
Authorized Officer Gijsbertus Beijer, International Preliminary Report on Patentability in PCT/US2009/057554, mailed Mar. 29, 2011, 7 pages.
Authorized officer Cheon Whan Cho, International Search Report and Written Opinion in PCT/US2009/066647, mailed Jul. 1, 2010, 16 pages.
Authorized officer Athina Nikitas-Etienne, International Preliminary Report on Patentability in PCT/US2009/066647, mailed Jun. 23, 2011, 12 pages.
Authorized officer Sung Chan Chung, International Search Report and Written Opinion for PCT/US2010/021824, mailed Aug. 23, 2010, 9 pages.
Authorized officer Beate Giffo-Schmitt, International Preliminary Report on Patentability in PCT/US2010/021824, mailed Aug. 18, 2011, 6 pages.
Authorized officer Sang Ho Lee, International Search Report and Written Opinion in PCT/US2010/034579, mailed Dec. 24, 2010, 9 pages.
Authorized officer Nora Lindner, International Preliminary Report on Patentability in PCT/US2010/034579, mailed Nov. 24, 2011, 7 pages.
Authorized officer Jeongmin Choi, International Search Report and Written Opinion in PCT/US2010/046193, mailed Apr. 26, 2011, 13 pages.
Authorized officer Philippe Bécamel, International Preliminary Report on Patentability in PCT/US2010/046193, mailed Mar. 8, 2012, 10 pages.
Authorized officer Sang Ho Lee, International Search Report and Written Opinion in PCT/US2010/059486, mailed Jul. 26, 2011, 9 pages.
Authorized officer Nora Lindner, International Preliminary Report on Patentability in PCT/US2010/059486, mailed Jun. 21, 2012, 6 pages.
Authorized officer Kwan Sik Sul, International Search Report and Written Opinion in PCT/US2011/063975, mailed May 18, 2012, 8 pages.
Authorized officer Simin Baharlou, International Preliminary Report on Patentability in PCT/US2011/063975, mailed Jun. 27, 2013, 5 pages.
Authorized officer Sang-Taek Kim, International Search Report and Written Opinion in PCT/US2011/061407, mailed May 22, 2012, 10 pages.
Authorized officer Lingfei Bai, International Preliminary Report on Patentability in PCT/US2011/061407, mailed Jun. 6, 2013, 7 pages.
Authorized officer Kwan Sik Sul, International Search Report and Written Opinion in PCT/US2012/023160, mailed May 24, 2012, 9 pages.
Authorized officer Simin Baharlou, International Preliminary Report on Patentability in PCT/US2012/023160, mailed Aug. 15, 2013, 6 pages.
Authorized officer Jeongmin Choi, International Search Report and Written Opinion in PCT/US2012/027146, mailed Sep. 24, 2012, 12 pages.
Authorized officer Athina Nickitas-Etienne, International Preliminary Report on Patentability in PCT/US2012/027146, mailed Sep. 19, 2013, 9 pages.
Authorized officer Tae Hoon Kim, International Search Report and Written Opinion in PCT/US2013/035837, mailed Jul. 30, 2013, 9 pages.
Authorized officer Agnès Wittmann-Regis, International Preliminary Report on Patentability in PCT/US2013/035837, mailed Oct. 23, 2014, 6 pages.
Authorized officer Sang Won Choi, International Search Report and Written Opinion in PCT/US2013/048275, mailed Oct. 14, 2013, 17 pages.
Authorized officer Hye Lyun Park, International Search Report and Written Opinion in PCT/US2013/050914, mailed Oct. 18, 2013, 11 pages.
Authorized officer Sang Won Choi, International Search Report and Written Opinion in PCT/US2013/024470, mailed May 27, 2013, 12 pages.
Authorized officer Simin Baharlou, International Preliminary Report on Patentability in PCT/US2013/024470, mailed Aug. 14, 2014, 9 pages.
Authorized officer June Young Son, International Search Report and Written Opinion in PCT/US2014/016298, mailed May 23, 2014, 15 pages.
Authorized officer Tae Hoon Kim, International Search Report and Written Opinion in PCT/US2014/027523, mailed Jul. 30, 2014, 14 pages.
Authorized officer June Young Son, International Search Report and Written Opinion in PCT/US2014/024191, mailed Aug. 7, 2014, 11 pages.
European Search Report in Application No. 10 81 5813.0, mailed Mar. 12, 2013, 9 pages.
Search Report and Action in TW Application No. 098132132, issued Dec. 6, 2012, 8 pages.
Search Report and Action in TW Application No. 098141930, issued Jul. 10, 2014, 7 pages.
Chinese First Office Action for Application No. 200880120050.6, Aug. 2, 2011, 10 pages.
Chinese First Office Action for Application No. 200980114639.X, May 14, 2012, 13 pages.
Ando et al., "10-W/mm AlGaN—GaN HFET with a Field Modulating Plate," IEEE Electron Device Letters, 2003, 24(5):289-291.
Arulkumaran et al., "Enhancement of Breakdown Voltage by AlN Buffer Layer Thickness in AlGaN/GaN High-electron-mobility Transistors on 4 in. Diameter Silicon," Applied Physics Letters, 2005, 86:123503-1-3.
Arulkumaran et al. "Surface Passivation Effects on AlGaN/GaN High-Electron-Mobility Transistors with $SiO_2$, $Si_3N_4$, and Silicon Oxynitride," Applied Physics Letters, 2004, 84(4):613-615.
Barnett and Shinn, "Plastic and Elastic Properties of Compositionally Modulated Thin Films," Annu. Rev. Mater. Sci., 1994, 24:481-511.
Chen et al., "High-performance AlGaN/GaN Lateral Field-effect Rectifiers Compatible with High Electron Mobility Transistors," Applied Physics Letters, 2008, 92, 253501-1-3.
Cheng et al., "Flat GaN Epitaxial Layers Grown on Si(111) by Metalorganic Vapor Phase Epitaxy Using Step-graded AlGaN Intermediate Layers," Journal of Electronic Materials, 2006, 35(4):592-598.
Coffie, "Characterizing and Suppressing DC-to-RF Dispersion in AlGaN/GaN High Electron Mobility Transistors," 2003, PhD Thesis, University of California, Santa Barbara, 169 pages.
Coffie et al., "Unpassivated p-GaN/AlGaN/GaN HEMTs with 7.1 W/mm at 10 GhZ," Electronic Letters, 2003, 39(19):1419-1420.
Chu et al., "1200-V Normally Off GaN-on-Si Field-effect Transistors with Low Dynamic On-Resistance," IEEE Electron Device Letters, 2011, 32(5):632-634.
Dora et al., "High Breakdown Voltage Achieved on AlGaN/GaN HEMTs with Integrated Slant Field Plates," IEEE, Electron Device Letters, 2006, 27(9):713-715.
Dora et al., "$ZrO_2$ Gate Dielectrics Produced by Ultraviolet Ozone Oxidation for GaN and AlGaN/GaN Transistors," J. Vac. Sci. Technol. B, 2006, 24(2)575-581.
Dora, "Understanding Material and Process Limits for High Breakdown Voltage AlGaN/GaN HEMTs," PhD Thesis, University of California, Santa Barbara, Mar. 2006, 157 pages.
Fanciulli et al., "Structural and Electrical Properties of $HfO_2$ Films Grown by Atomic Layer Deposition on Si, Ge, GaAs and GaN," Mat. Res. Soc. Symp. Proc., 2004, vol. 786, 6 pages.

(56) References Cited

OTHER PUBLICATIONS

Green et al., "The Effect of Surface Passivation on the Microwave Characteristics of Undoped AlGaN/GaN HEMTs," IEEE Electron Device Letters, 2000, 21(6):268 270.
Gu et al., "AlGaN/GaN MOS Transistors using Crystalline $ZrO_2$ as Gate Dielectric," Proceedings of SPIE, 2007, vol. 6473, 64730S-1-8.
Higashiwaki et al. "AlGaN/GaN Heterostructure Field-Effect Transistors on 4H-SiC Substrates with Current-Gain Cutoff Frequency of 190 GHz," Applied Physics Express, 2008, 021103-1-3.
Hwang et al., "Effects of a Molecular Beam Epitaxy Grown AlN Passivation Layer on AlGaN/GaN Heterojunction Field Effect Transistors," Solid-State Electronics, 2004, 48:363-366.
Im et al., "Normally Off GaN MOSFET Based on AlGaN/GaN Heterostructure with Extremely High 2DEG Density Grown on Silicon Substrate," IEEE Electron Device Letters, 2010, 31(3):192-194.
Karmalkar and Mishra, "Enhancement of Breakdown Voltage in AlGaN/GaN High Electron Mobility Transistors Using a Field Plate," IEEE Transactions on Electron Devices, 2001, 48(8):1515-1521.
Karmalkar and Mishra, "Very High Voltage AlGaN/GaN High Electron Mobility Transistors Using a Field Plate Deposited on a Stepped Insulator," Solid-State Electronics, 2001, 45:1645-1652.
Keller et al., "GaN—GaN Junctions with Ultrathin AlN Interlayers: Expanding Heterojunction Design," Applied Physics Letters, 2002, 80(23):4387-4389.
Khan et al., "AlGaN/GaN Metal Oxide Semiconductor Heterostructure Field Effect Transistor," IEEE Electron Device Letters, 2000, 21(2):63-65.
Kim, "Process Development and Device Characteristics of AlGaN/GaN HEMTs for High Frequency Applications," PhD Thesis, University of Illinois at Urbana-Champaign, 2007, 120 pages.
Kumar et al., "High Transeonductance Enhancement-mode AlGaN/GaN HEMTs on SiC Substrate," Electronics Letters, 2003, 39(24):1758-1760.
Kuraguchi et al., "Normally-off GaN-MISFET with Well-controlled Threshold Voltage," Phys. Stats. Sol., 2007, 204(6):2010-2013.
Lanford et al., "Recessed-gate Enhancement-mode GaN HEMT with High Threshold Voltage, " Electronic Letters, 2005, 41(7):449-450.
Lee et al., "Self-aligned Process for Emitter- and Base-regrowth GaN HBTs and BJTs," Solid-State Electronics, 2001, 45:243-247.
Marchand et al., "Metalorganic Chemical Vapor Deposition on GaN on Si(111): Stress Control and Application to Filed-effect Transistors," Journal of Applied Physics, 2001, 89(12):7846-7851.
Mishra et al., "AlGaN/GaN HEMTs—An Overview of Device Operation and Applications," Proceedings of the IEEE, 2002, 90(6):1022-1031.
Nanjo et al., "Remarkable Breakdown Voltage Enhancement in AlGaN Channel High Electron Mobility Transistors," Applied Physics Letters 92 (2008), 3 pages.
Napierala et al., "Selective GaN Epitaxy on Si(111) Substrates Using Porous Aluminum Oxide Buffer Layers," Journal of the Electrochemical Society, 2006. 153(2):G125-G127, 4 pages.
Ota and Nozawa, "AlGaN/GaN Recessed MIS-gate HFET with High-threshold-voltage Normally-off Operation for Power Electronics Applications," IEEE Electron Device Letters, 2008, 29(7):668-670.
Palacios et al., "AlGaN/GaN HEMTs with an InGaN-based Back-barrier," Device Research Conference Digest, 2005, DRC '05 63rd, pp. 181-182.
Palacios et al., "AlGaN/GaN High Electron Mobility Transistors with InGaN Back-Barriers," IEEE Electron Device Letters, 2006, 27(1):13-15.
Palacios et al., "Nitride-based High Electron Mobility Transistors with a GaN Spacer," Applied Physics Letters, 2006, 89:073508-1-3.
Pei et al., "Effect of Dielectric Thickness on Power Performance of AlGaN/GaN HEMTs," IEEE Electron Device Letters, 2009, 30(4):313-315.
"Planar, Low Switching Loss, Gallium Nitride Devices for Power Conversion Applications," SBIR N121-090 (Navy), 2012, 3 pages.
Rajan et al., "Advanced Transistor Structures Based on N-face GaN," 32M International Symposium on Compound Semiconductors (ISCS), Sep. 18-22, 2005, Europa-Park Rust, Germany, 2 pages.
Reiher et al., "Efficient Stress Relief in GaN Heteroepitaxy on Si(111) Using Low-temperature AlN Interlayers," Journal of Crystal Growth, 2003, 248:563-567.
Saito et al., "Recessed-gate Structure Approach Toward Normally Off High-voltage AlGaN/GaN HEMT for Power Electronics Applications," IEEE Transactions on Electron Device, 2006, 53(2):356-362.
Shelton et al., "Selective Area Growth and Characterization of AlGaN/GaN Heterojunction Bipolar Transistors by Metalorganic Chemical Vapor Deposition," IEEE Transactions on Electron Devices, 2001, 48(3):490-494.
Shen, "Advanced Polarization-based Design of AlGaN/GaN HEMTs," Jun. 2004, PhD Thesis, University of California, Santa Barbara, 192 pages.
Sugiura et al., "Enhancement-mode n-channel GaN MOSFETs Fabricated on p-GaN Using $HfO_2$ as Gate Oxide," Electronics Letters, 2007, vol. 43, No. 17, 2 pages.
Suh et al. "High-Breakdown Enhancement-mode AlGaN/GaN HEMTs with Integrated Slant Field-Plate," Electron Devices Meeting, 2006, IEDM '06 International, 3 pages.
Tipirneni et al. "Silicon Dioxide-encapsulated High-Voltage AlGaN/GaN HFETs for Power-Switching Applications," IEEE Electron Device Letters, 2007, 28(9):784-786.
Vetury et al., "Direct Measurement of Gate Depletion in High Breakdown (405V) Al/GaN/GaN Heterostructure Field Effect Transistors," IEDM 98, 1998, pp. 55-58.
Wang et al., "Comparison of the Effect of Gate Dielectric Layer on 2DEG Carrier Concentration in Strained AlGaN/GaN Heterostructure," Mater. Res, Soc. Symp. Proc., 2007, vol. 831, 6 pages.
Wang et al., "Enhancement-mode $Si_3N_4$/AlGaN/GaN MISHFETs," IEEE Electron Device Letters, 2006, 27(10):793-795.
Wu, "AlGaN/GaN Microwave Power High-Mobility Transistors," PhD Thesis, University of California, Santa Barbara, Jul. 1997, 134 pages.
Wu et al., "A 97.8% Efficient GaN HEMT Boost Converter with 300-W Output Power at 1MHz," Electronic Device Letters, 2008, IEEE, 29(8):824-826.
Yoshida, "AlGan/GaN Power FET," Furukawa Review, 2002, 21:7-11.
Zhang, "High Voltage GaN HEMTs with Low On-resistance for Switching Applications," PhD Thesis, University of California, Santa Barbara, Sep. 2002, 166 pages.
Zhanghong Content, Shanghai Institute of Metallurgy, Chinese Academy of Sciences, "Two-Dimensional Electron Gas and High Electron Mobility Transistor (HEMT)," Dec. 31, 1984, 17 pages.
Authorized officer Simin Baharlou, International Preliminary Report on Patentability in PCT/US2013/048275, mailed Jan. 8, 2015, 14 pages.
Authorized officer Yukari Nakamura, International Preliminary Report on Patentability in PCT/US2013/050914, mailed Jan. 29, 2015, 8 pages.
Authorized officer Kihwan Moon, International Preliminary Report on Patentability in PCT/US2014/016298, mailed Aug. 27, 2015, 12 pages.
Authorized officer Nora Lindner, International Preliminary Report on Patentability in PCT/US2014/027523, mailed Sep. 24, 2015, 11 pages.
Authorized officer Kihwan Moon, International Preliminary Report on Patentability in PCT/US2014/024191, mailed Sep. 24, 2015, 8 pages.
Authorized officer Agnès Wittmann-Regis, International Preliminary Report on Patentability in PCT/US2014/046030, mailed Jan. 28, 2016, 9 pages.

III-NITRIDE TRANSISTOR INCLUDING A P-TYPE DEPLETING LAYER

CROSS-REFERENCE TO RELATED APPLICATION

This application claims priority to U.S. Provisional Application No. 61/856,573, filed on Jul. 19, 2013. The disclosure of the prior application is considered part of and is incorporated by reference in the disclosure of this application.

TECHNICAL FIELD

This invention relates to semiconductor devices, in particular III-Nitride transistors.

BACKGROUND

Currently, typical power semiconductor transistors, including devices such as power MOSFETs and insulated gate bipolar transistors (IGBTs), are fabricated with silicon (Si) semiconductor material. More recently, silicon carbide (SiC) power devices have been considered due to their superior properties. III-Nitride or III-N semiconductor devices, such as gallium nitride (GaN) devices, are now emerging as attractive candidates to carry large currents, support high voltages and to provide very low on-resistance and fast switching times. Although high voltage III-N diodes and transistors are beginning to be commercialized, further improvements are needed in order to improve the efficiency and output characteristics of the devices.

SUMMARY

In a first aspect, a transistor is described. The transistor includes a III-N layer structure comprising a III-N channel layer between a III-N barrier layer and a p-type III-layer. The transistor further includes a source, a drain, and a gate between the source and the drain, the gate being over the III-N layer structure. The p-type III-N layer includes a first portion that is at least partially in a device access region between the gate and the drain, and the first portion of the p-type III-N layer is electrically connected to the source and electrically isolated from the drain.

In a second aspect, a transistor is described. The transistor includes a III-N layer structure comprising a III-N channel layer between a III-N barrier layer and a p-type III-N layer. The transistor further includes a source, a drain, and a gate between the source and the drain, the gate being over the III-N layer structure. The transistor also includes a channel in the III-N channel layer, the channel extending from the source to the drain when the gate is biased relative to the source at a voltage which is higher than a threshold voltage of the transistor. The p-type III-N layer is electrically connected to the source and electrically isolated from the drain.

In a third aspect, a transistor is described. The transistor includes a III-N layer structure comprising a III-N channel layer and a III-N barrier layer, a 2DEG channel in the III-N channel layer, a source and a drain, and a gate between the source and the drain, the gate being over the III-N layer structure. The transistor further includes a p-type III-N layer which is at least partially in an access region between the gate and the drain. A p-type doping level in the p-type III-N layer is selected such that mobile charge in the 2DEG channel in the access region between the gate and the drain is depleted while the gate is biased relative to the source at a voltage lower than a transistor threshold voltage and the drain is biased above a minimum voltage relative to the source, but not depleted while the gate is biased relative to the source at a voltage lower than the transistor threshold voltage and the drain is biased below the minimum voltage relative to the source.

Transistors described herein may each include one or more of the following. The transistor can further include a 2DEG channel in the III-N channel layer. A compositional difference between the III-N barrier layer and the III-N channel layer can cause the 2DEG channel to be induced in the III-N channel layer. The transistor can have a threshold voltage, wherein the transistor is configured such that when the gate is biased relative to the source at a voltage greater than the threshold voltage, the 2DEG channel extends continuously from the source to the drain, and when the gate is biased relative to the source at a voltage less than the threshold voltage and the drain is biased relative to the source at a positive voltage that is less than a minimum voltage, the 2DEG is depleted of mobile charge in a gate region of the transistor. The transistor can be configured such that when the gate is biased relative to the source at a voltage less than the threshold voltage and the drain is biased relative to the source at a positive voltage that is greater than the minimum voltage, the 2DEG is depleted of mobile charge in the device access region between the gate and the drain. The minimum voltage can be 20V or larger. The minimum voltage can be in a range of 20V to 100V.

The transistor can have a threshold voltage, wherein a p-type doping level in the p-type III-N layer is selected such that mobile charge in the 2DEG channel in the access region between the gate and the drain is depleted while the gate is biased relative to the source at a voltage lower than the threshold voltage and the drain is biased above a minimum voltage relative to the source, but not depleted while the gate is biased relative to the source at a voltage higher than the threshold voltage. The transistor can have a threshold voltage, wherein a p-type doping level in the p-type III-N layer is selected such that mobile charge in the 2DEG channel in the access region between the gate and the drain is depleted while the gate is biased relative to the source at a voltage lower than the threshold voltage and the drain is biased above a minimum voltage relative to the source, but not depleted while the gate is biased relative to the source at a voltage lower than the threshold voltage and the drain is biased below the minimum voltage relative to the source. The minimum voltage can be in a range of 20V to 100V. An areal mobile charge density or a p-type doping density in the p-type III-N layer can be in the range of 50-75% of an areal sheet charge density of mobile charge in the 2DEG channel.

The transistor can further include a recess extending through the p-type III-N layer, wherein the gate is in the recess. The III-N layer structure can be oriented in an N-polar direction, and the gate can be over an N-face of the III-N layer structure. The p-type III-N layer can include a superlattice comprising alternating III-N layers of varying bandgap and/or composition. The channel can be between the p-type III-N layer and the gate. A portion of the III-N channel layer can be below the drain and between the drain and the p-type III-N layer. The p-type III-N layer can be electrically connected to the source.

The details of one or more embodiments of the subject matter described in this specification are set forth in the accompanying drawings and the description below. Other features, aspects, and advantages of the subject matter will become apparent from the description, the drawings, and the claims.

DESCRIPTION OF DRAWINGS

Like reference symbols in the various drawings indicate like elements.

DETAILED DESCRIPTION

Described herein are lateral III-Nitride transistors that include a p-type III-Nitride layer as a channel depleting layer. Specifically, the p-type layer causes channel charge in an access region of the transistor to be depleted while the transistor is biased OFF (i.e., while the gate of the transistor is biased relative to the source at a voltage lower than the transistor threshold voltage), but not to be depleted while the transistor is biased ON (i.e., while the gate of the transistor is biased relative to the source at a voltage higher than the transistor threshold voltage). Such a structure allows for a compact transistor with a very high breakdown voltage while maintaining a low on-resistance.

As used herein, the terms III-Nitride or III-N materials, layers, devices, etc., refer to a material or device comprised of a compound semiconductor material according to the stoichiometric formula $B_w Al_x In_y Ga_z N$, where w+x+y+z is about 1, $0 \le w \le 1$, $0 \le x \le 1$, $0 \le y \le 1$, and $0 \le z \le 1$. In a III-Nitride or III-N device, such as a transistor or HEMT, the conductive channel can be partially or entirely contained within a III-N material layer.

Figure 1:
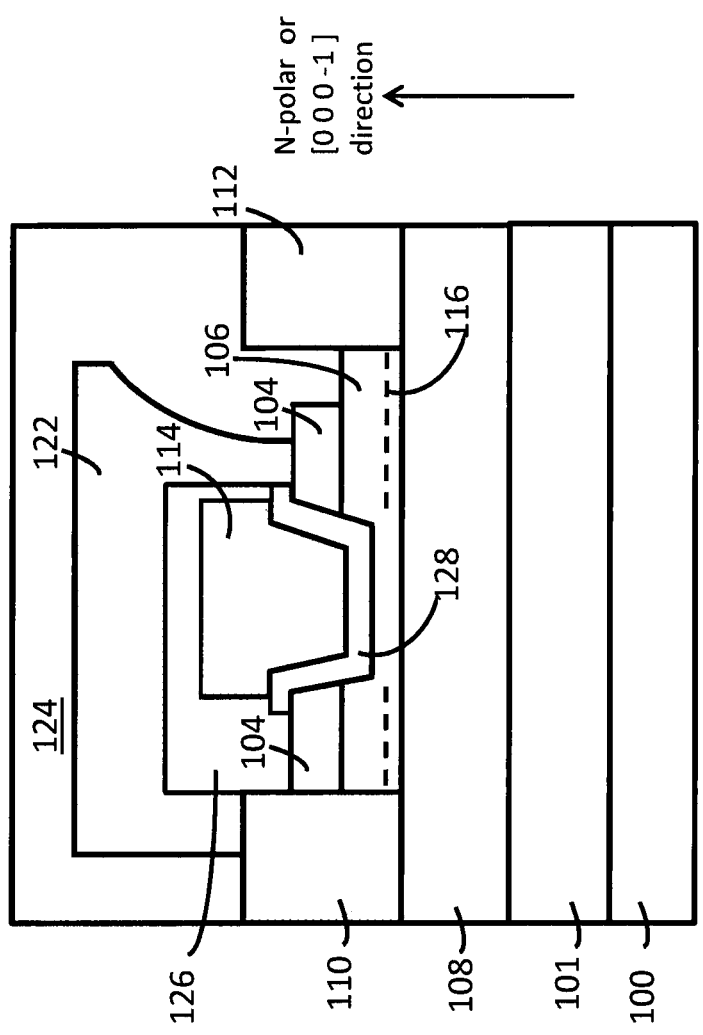
FIG. 1 is a cross-sectional view of an N-polar III-Nitride transistor.

Referring now to FIG. 1, the transistor device of FIG. 1 includes a first III-N layer 101, for example GaN, grown on a suitable substrate 100, which can for example be silicon, silicon carbide, sapphire, AlN, or GaN. The device further includes a III-N barrier layer 108, for example $Al_x Ga_{1-x} N$, on the first III-N layer 101. The bandgap of the III-N barrier layer 108 is typically greater than that of the first III-N layer 101. On top of the III-N barrier layer is formed a III-N channel layer 106, which can for example be unintentionally doped (UID) n-type GaN. The III-N channel layer 106 has a different composition than the III-N barrier layer 108, the bandgap of the III-N barrier layer 108 is greater than that of the III-N channel layer 106, and the thicknesses of layers 108 and 106 are selected such that a two-dimensional electron gas (2DEG) channel 116 (indicated by the dashed line in FIG. 1) is induced in the III-N channel layer 106 adjacent the interface between layers 106 and 108. Additionally, the portion of the first III-N layer 101 which is adjacent to barrier layer 108 can be doped with n-type dopants to increase the mobile charge density in the 2DEG channel 116. A p-type III-N layer 104 is formed over the channel layer 106. The p-type III-N layer 104 is at least between the gate 114 and the drain 112, and may optionally also be between the source 110 and gate 114, as shown in FIG. 1. The p-type III-N layer 104 can be a single III-N layer, such as GaN, or may optionally have a varying composition of group-III elements. For example, the p-type III-N layer can be a superlattice formed of alternating layers of GaN and AlGaN. Additionally, while in some cases the entire layer 104 is doped p-type, in other cases only a portion of the layer is doped p-type. For example, the layer 104 can include a series of p-doped portions each separated by undoped portions.

III-N layers 101, 108, 106, and 104 are N-polar III-N layers, oriented as shown in the [ 0 0 0 −1 ] direction. A gate 114 is formed in a recess that extends at least partially through p-type III-N layer 104, and optionally extends partially through the III-N channel layer 106, as shown in FIG. 1. An insulating layer 128 is optionally included between gate 114 and the underlying III-N layers. As seen in FIG. 1, the source and drain contacts 110 and 112, as well as the gate 114, are all formed over the N-face (e.g., [ 0 0 0 −1 ] face) of the III-N material layers, which is on an opposite side of the III-N material layers from the substrate 100. Source and drain contacts 110 and 112, respectively, are on opposite sides of the gate 114 and contact the device 2DEG channel 116 that is formed in layer 106. The portions of the III-N materials directly below the lowermost portion of the gate 114 are referred to as the gate region of the device. The portions of the III-N materials directly below the source and drain 110 and 112 are respectively referred to as the source and drain regions of the device. The portions of III-N material between the gate region and the source region, and between the gate region and the drain region, are referred to as the device access regions.

The p-type doping level in the p-type layer 104 is selected such that channel charge in the drain side access region (i.e., the access region between the gate and the drain) of the transistor is depleted while the transistor is biased OFF (i.e., while the gate of the transistor is biased relative to the source at a voltage lower than the transistor threshold voltage), but not depleted (i.e., is substantially electrically conductive) while the transistor is biased ON (i.e., while the gate of the transistor is biased relative to the source at a voltage higher than the transistor threshold voltage). For example, the areal mobile charge density or the p-type doping density in the p-type layer can be in the range of 50-75% of the areal sheet charge density of the electrons in the 2DEG channel 116.

As seen in FIG. 1, the recess beneath the gate can be formed to a sufficient depth to ensure that the device is an enhancement-mode device, such that the device has a threshold voltage greater than 0V. That is, when 0V is applied to the gate 114 relative to the source 110 and a positive voltage is applied to the drain 112 relative to the source 110, channel charge in the gate region is depleted, and the device is in a non-conductive state. When a sufficiently positive voltage is applied to the gate 114 relative to the source 110, the 2DEG charge in the gate region is induced, and the device becomes conductive.

Alternatively, the device in FIG. 1 can be modified to be a depletion-mode device. If the depth of the recess below the gate is decreased, then the transistor can be a depletion-mode device, where the device is ON when 0V is applied to the gate relative to the source, and a sufficiently negative voltage must be applied to the gate relative to the source to turn the device OFF. For example, the device may be a depletion-mode device if the gate recess is not included, if the recess only extends partially through the p-type layer 104, if the recess extends through the entire p-type layer 104 but does not extend into the channel layer 106, or if the recess only extends a very short distance into the channel layer 106.

As further illustrated in FIG. 1, the source 110 is electrically connected to the p-type layer 104. For example, the device can include a field plate 122 which directly contacts the p-type layer 104 and is electrically connected to the source 110. As also seen in FIG. 1, the drain 112 is electrically isolated from (i.e., is not electrically connected to) the p-type III-N layer 104. As used herein, two or more contacts or other items such as conductive layers or components are said to be "electrically connected" if they are connected by a material which is sufficiently conducting to ensure that the electric potential at each of the contacts or other items is intended to be the same, i.e., is about the same, at all times under any bias conditions. An encapsulation layer, such as dielectric layer 124, may also be formed over the entire structure.

The device of FIG. 1 operates as follows. When the gate 114 is biased relative to the source 110 at a voltage that is greater than the threshold voltage of the device, there is 2DEG charge below the gate 114 in the gate region, and therefore a continuous 2DEG from the source 110 to the drain 112. When a positive voltage is applied to the drain 112, electrons flow from the source 110, through the continuous 2DEG channel 116, and into the drain 112. A conventional current flows from the drain to the source, and the device is considered to be ON.

When the gate 114 is biased relative to the source 110 at a voltage that is lower than the threshold voltage of the device, there is no 2DEG in the gate region below the gate 114, and therefore the 2DEG is discontinuous between the source 110 and the drain 112. When a small positive voltage is applied to the drain 112, the portion of the 2DEG in the access region between the gate 114 and the drain 112 attains the same potential (i.e., the same voltage) as the drain 112. The p-type layer 104 and the source connected field plate 122 remain at substantially the same potential as the source 110. As the voltage on the drain is progressively increased, a positive electric field is created from the portion of the 2DEG in the drain-side access region that is directly beneath the p-type layer up to the p-type layer 104. This causes electrons from the portion of the 2DEG in the drain-side access region to deplete out, and the p-region in p-type layer 104 is also progressively depleted of holes. The doping levels, layer thicknesses, and 2DEG sheet charge density are chosen such that, at all voltages greater than a minimum drain voltage, where the minimum drain voltage can for example be between 20V and 100V, almost all or substantially all mobile carriers in the 2DEG in the drain-side access region and in the p-type layer 104 deplete out. Any subsequent increase in drain voltage causes charge imaging from regions in or near the drain 112 to the field plate 122. Because the p-type layer 104 is fully depleted, it no longer remains at ground potential and floats up in voltage. There is therefore a smooth change of potential from the drain 112 to the field plate 122, and no field peaking occurs at the edge of the field plate, as in conventional planar HEMTs. This results in a larger, more uniform field before breakdown occurs, and hence a larger breakdown voltage.

Figure 2A:
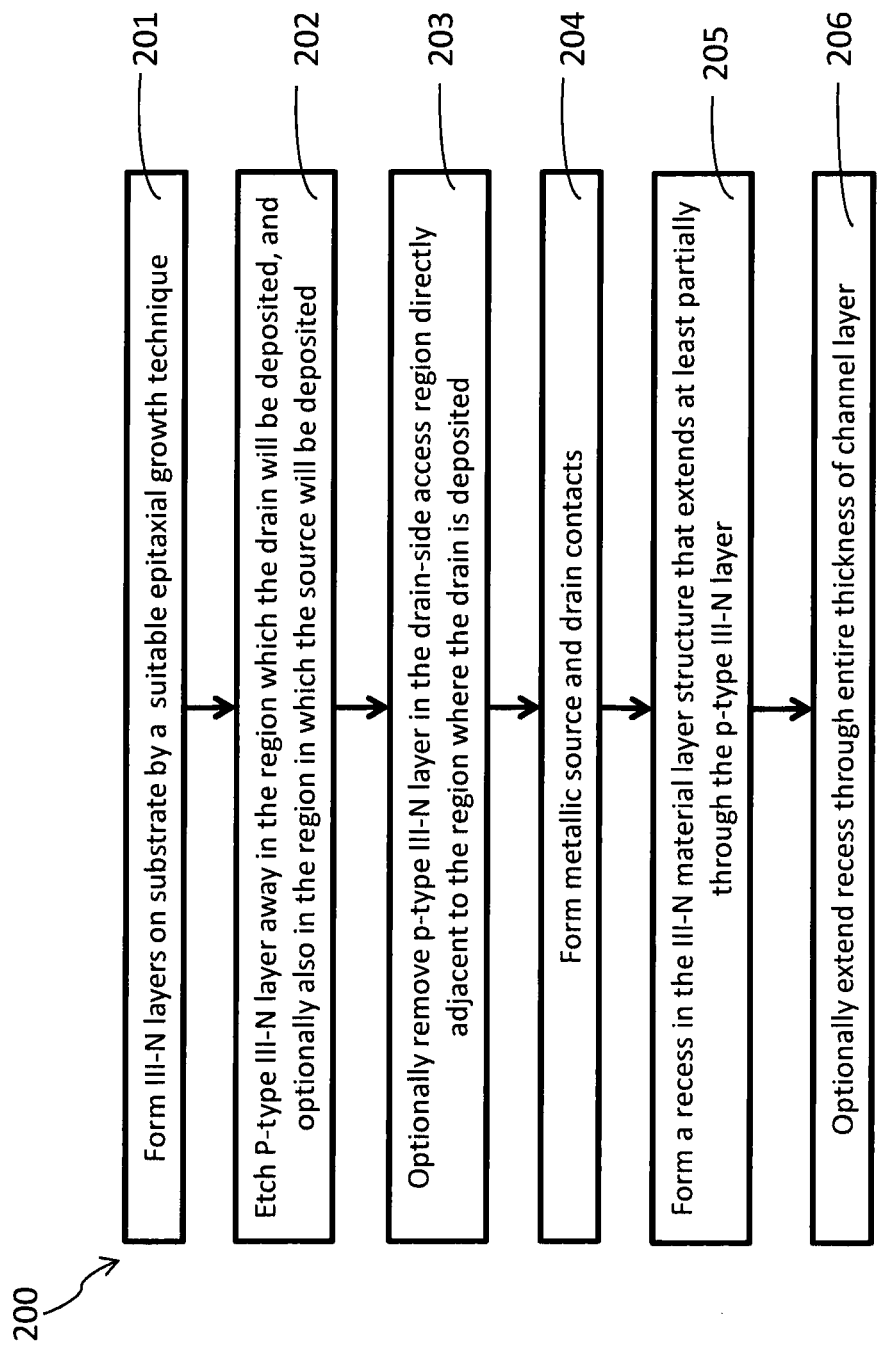
FIGS. 2A and 2B are a block diagram showing the formation of an N-polar III-Nitride transistor.
Figure 2B:
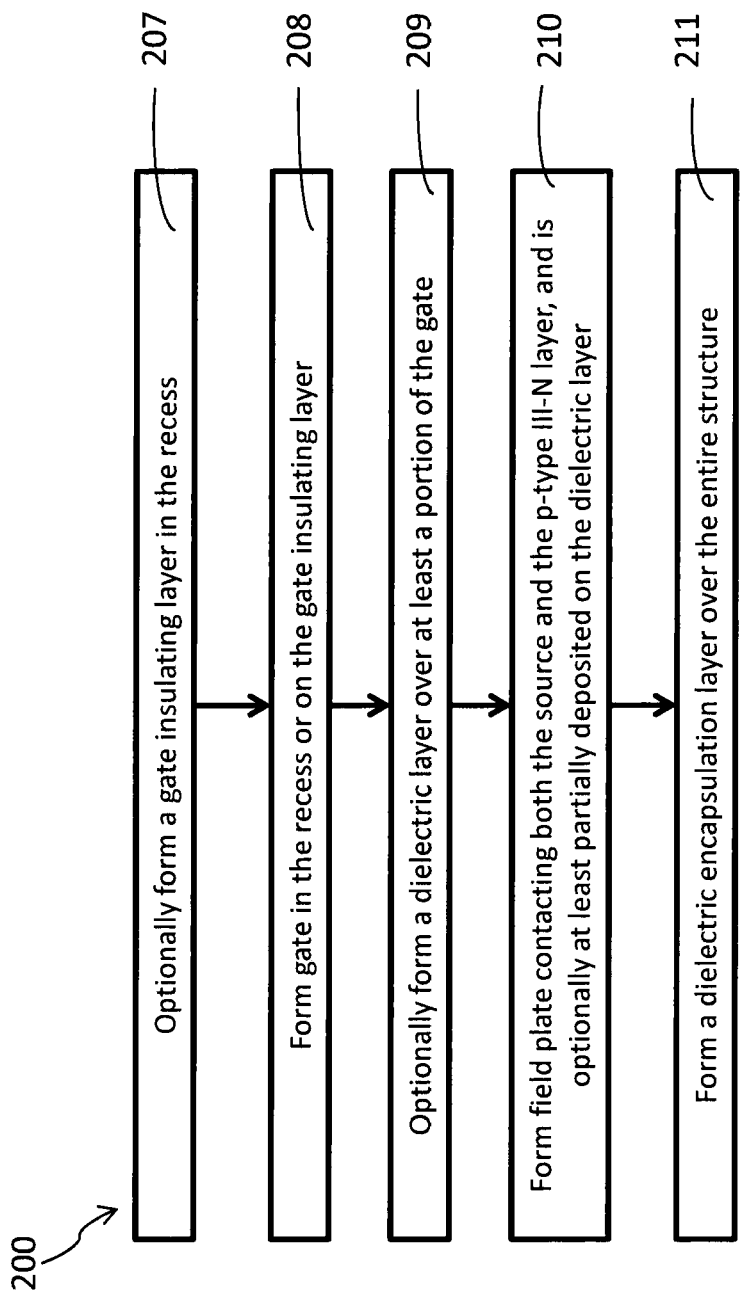

The device of FIG. 1 can be formed according to the process 200 illustrated in the block diagram of FIGS. 2A and 2B. First, III-N layers 101, 108, 106, and 104 are formed on substrate 100 by a suitable epitaxial growth technique, for example metal-organic chemical vapor deposition (MOCVD), molecular beam epitaxy (MBE), or hydride vapor phase epitaxy (HVPE) (step 201). Next, the p-type III-N layer 104 is etched away in the region in which the drain 112 is to be deposited, and optionally also in the region in which the source 110 is to be deposited (step 202). The portion of the p-type III-N layer 104 that is in the drain-side access region and is directly adjacent to the region where the drain 112 is deposited may also be removed (step 203), in order to ensure that the drain 112 does not directly contact the p-type III-N layer 104. Then, metallic source and drain contacts 110 and 112, respectively, are formed (step 204). Next, a recess is formed in the III-N material layer structure (step 205). The recess extends at least partially through the p-type III-N layer 104, and typically extends through the entire p-type III-N layer 104 and partially through the channel layer 106. The recess may optionally extend through the entire thickness of the channel layer 106 (step 206, not shown in FIG. 1). Next, the gate 114 is formed in the recess (step 208). Optionally, prior to forming the gate 114, a gate insulating layer 128 can be formed in the recess (step 207), and the gate 114 can be formed on the insulating layer (step 208). Next, field plate 122, which contacts both the source 110 and the p-type III-N layer 104, is formed (step 210). Optionally, prior to forming the field plate 122, a dielectric layer 126 can be formed over at least a portion of the gate 114 (step 209), and the metal which forms the field plate 122 can be at least partially deposited on the dielectric layer 126 (step 210). Finally, a dielectric encapsulation layer 124 can be formed over the entire structure (step 211).

Figure 3:
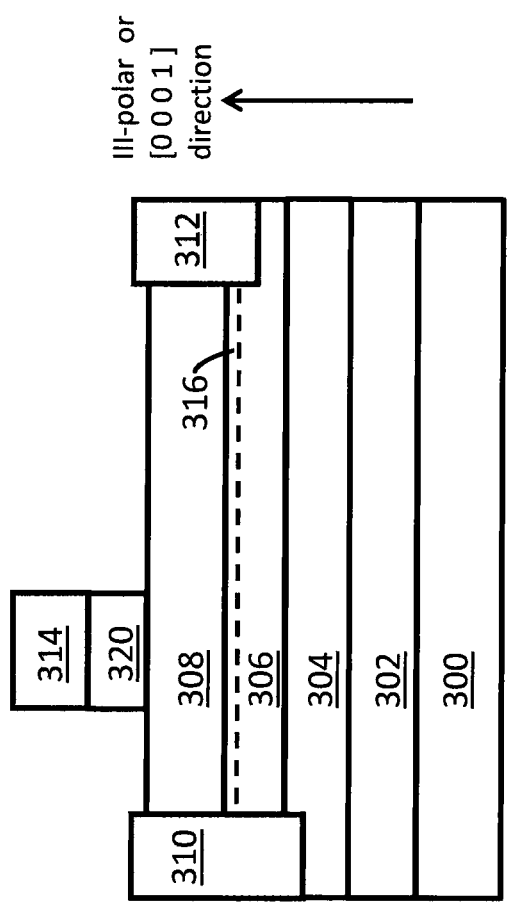
FIGS. 3 and 4 are cross-sectional views of III-polar III-Nitride transistors.
Figure 4:
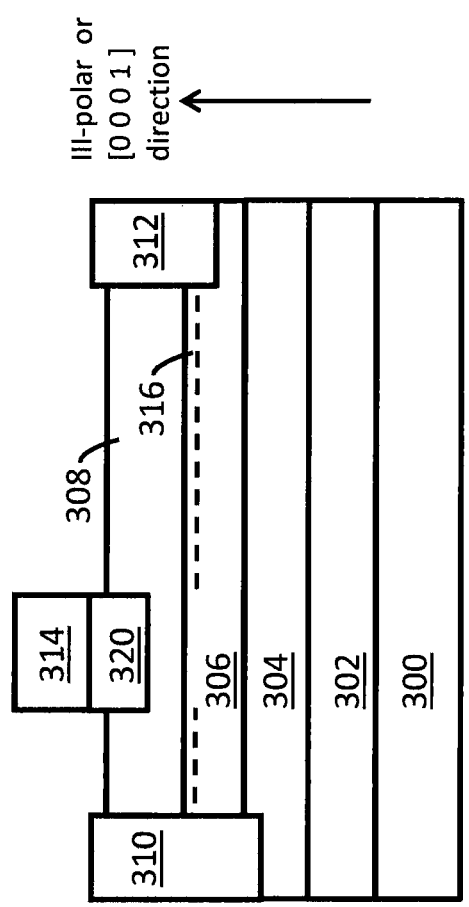

FIGS. 3 and 4 illustrate transistors which operate similarly to that of FIG. 1, except that the III-N layers 302, 304, 306, and 308 are formed in a III-polar or [ 0 0 0 1 ] orientation. FIG. 3 illustrates a depletion-mode transistor, while FIG. 4 illustrates an enhancement-mode transistor. The devices of FIGS. 3 and 4 include a substrate 300, a III-N buffer layer 302, a p-type III-N layer 304, a III-N channel layer 306, and a III-N barrier layer 308, where the composition and thickness of the barrier layer 308 are selected such that a 2DEG channel 316 is induced in the channel layer 306. As in the device of FIG. 1, the source 310 electrically contacts (i.e., is electrically connected to) the p-type layer 304, while the drain 312 is electrically isolated from the p-type layer 304. That is, as shown in FIGS. 3 and 4, the p-type III-N layer 304 is below the III-N channel layer 306, and the source 310 extends through an entire thickness of the III-N channel layer 306 to contact the p-type III-N layer 304, while the drain 312 does not extend through the entire thickness of the III-N channel layer 306, so that a portion of the III-N channel layer 306 is below the drain 312 and is between the drain 312 and the p-type III-N layer 304. Also as in FIG. 1, the p-doping level and thickness of the p-type layer is selected such that the 2DEG channel 316 in the device access regions is substantially populated with mobile charge while the device is biased in the ON state, but becomes depleted of charge when the device is biased in the OFF state, and a voltage greater than a minimum voltage level is applied to the drain, such that when the device is in the OFF state and blocks a sufficiently large voltage, the 2DEG in at least a portion of the device access regions is substantially depleted of mobile charge. For example, as with the device in FIG. 1, the areal mobile charge density or the p-type doping density in the p-type layer 304 can be in the range of 50-75% of the areal sheet charge density of the electrons in the 2DEG channel 316.

The devices of FIGS. 3 and 4 operate as follows. When the gate 314 is biased relative to the source 310 at a voltage that is greater than the threshold voltage of the device, there is 2DEG charge below the gate 314 in the gate region, and therefore a continuous 2DEG from the source 310 to the drain 312. When a positive voltage is applied to the drain 312, electrons flow from the source 310, through the continuous 2DEG channel 316, and into the drain 312. A conventional current flows from the drain 312 to the source 310, and the device is considered to be ON.

When the gate 314 is biased relative to the source 310 at a voltage that is lower than the threshold voltage of the device, there is no 2DEG in the gate region below the gate 314, and therefore the 2DEG is discontinuous between the source 310 and the drain 312. When a small positive voltage is applied to the drain 312 relative to the source, the portion of the 2DEG in the access region between the gate 314 and the drain 312 attains the same potential (i.e., the same voltage) as the drain 312. The p-type layer 304 remains at substantially the same potential as the source 310, since the source 310 and the p-type layer 304 are electrically connected as shown. As the voltage on the drain 312 is progressively increased, a positive electric field is created from the portion of the 2DEG in the drain-side access region down to the underlying portion of the p-type layer 304 in the drain-side access region. This causes electrons from the portion of the 2DEG in the drain-side access region to deplete out, and the p-region in the portion of the p-type layer 304 in the drain-side access region is also progressively depleted of holes. Because the portion of the 2DEG 316 that is in the source-side access region remains at approximately the same voltage as the source, it does not become depleted of mobile carriers as the drain voltage increases when the device is biased in the off state. Similarly, the portion of the p-type layer 304 in the source-side access region does not become depleted of holes as the drain voltage increases when the device is biased in the off state. Thus, even though the p-type III-N layer 304 extends from the source region all the way to the drain region of the device, it only serves to deplete mobile charges from the 2DEG in the drain-side access region (and not the source-side access region) as the drain voltage increases when the device is biased in the off state.

The doping levels, layer thicknesses, and 2DEG sheet charge density are chosen such that, at all voltages greater than a minimum drain voltage, where the minimum drain voltage can for example be between 20V and 100V, almost all or substantially all mobile carriers in the 2DEG in the drain-side access region and in the p-type layer 304 deplete out. This results in a larger, more uniform field before breakdown occurs, and hence a larger breakdown voltage.

A number of implementations have been described. Nevertheless, it will be understood that various modifications may be made without departing from the spirit and scope of the techniques and devices described herein. Accordingly, other implementations are within the scope of the following claims.

What is claimed is:

1. A transistor, comprising:
   a III-N layer structure comprising a III-N channel layer between a III-N barrier layer and a p-type III-N layer, wherein the III-N channel layer includes a 2DEG channel formed adjacent an interface between the III-N channel layer and the III-N barrier layer;
   a source and a drain, each of which being directly connected to the III-N channel layer;
   a gate between the source and the drain, the gate being over the III-N layer structure, wherein the p-type III-N layer includes a first portion that is disposed in a device access region between the gate and the drain; and
   a field plate electrically connected to the source and to the first portion of the p-type III-N layer, wherein the first portion of the p-type III-N layer is electrically isolated from the drain.

2. The transistor of claim 1, wherein a dopant concentration in the p-type III-N layer is such that an areal mobile charge density or a p-type doping density in the p-type III-N layer is in the range of 50-75% of an areal sheet charge density of mobile charge in the 2DEG channel.

3. The transistor of claim 2, having a threshold voltage, wherein
   mobile charge in the 2DEG channel in the access region between the gate and the drain is depleted while the gate is biased relative to the source at a voltage lower than the threshold voltage and the drain is biased above a minimum voltage relative to the source, but not depleted while the gate is biased relative to the source at a voltage lower than the threshold voltage and the drain is biased below the minimum voltage relative to the source, and
   the minimum voltage is in a range of 20V to 100V.

4. The transistor of claim 1, wherein
   the p-type III-N layer further comprises a second portion disposed in a device access region between the source and the gate,
   the transistor further comprises a recess extending through, and separating the first and second portions of, the p-type III-N layer, and
   the gate is in the recess.

5. The transistor of claim 1, wherein the III-N layer structure is oriented in an N-polar direction, and the gate is over an N-face of the III-N layer structure.

6. The transistor of claim 1, wherein the p-type III-N layer includes a superlattice comprising alternating p-doped III-N layers and un-doped III-N layers.

7. A transistor, comprising:
   a III-N channel layer;
   a III-N barrier layer, wherein the III-N channel layer includes a 2DEG channel adjacent an interface between the III-N channel layer and the III-N barrier layer;
   a source and a drain, each of which being directly connected to the III-N channel layer;
   a gate between the source and the drain, the gate being over the 2DEG channel;
   a p-type III-N layer disposed in a device access region between the gate and the drain; and
   a field plate that is electrically connected to the source and to the p-type III-N layer, and is electrically isolated from the gate,
   wherein the p-type III-N layer is electrically isolated from the drain, and
   wherein a dopant concentration in the p-type III-N layer is such that an areal mobile charge density or a p-type doping density in the p-type III-N layer is in the range of 50-75% of an areal sheet charge density of mobile charge in the 2DEG channel.

8. The transistor of claim 7, wherein
   the p-type III-N layer has a portion disposed in a device access region between the source and the gate, and
   the transistor further comprises a recess extending through the p-type III-N layer, such that the gate is in the recess.

9. The transistor of claim 7, wherein
   a III-N layer structure including the III-N channel layer, the III-N barrier layer and the p-type III-N layer is oriented in an N-polar direction, and
   the gate is over an N-face of the III-N layer structure.

10. The transistor of claim 7, wherein the p-type III-N layer includes a superlattice comprising alternating p-doped III-N layers and un-doped III-N layers.

* * * * *